PLURAL EMITTER SEMICONDUCTOR DEVICE

Filed June 20, 1960 2 Sheets-Sheet 1

WITNESSES
Edwin E. Basler
Charles L. Menzemer

INVENTOR
Gene Strull
BY
Frederick Shapoe
ATTORNEY

Oct. 5, 1965 G. STRULL 3,210,621

PLURAL EMITTER SEMICONDUCTOR DEVICE

Filed June 20, 1960

2 Sheets-Sheet 2

United States Patent Office 3,210,621
Patented Oct. 5, 1965

3,210,621

PLURAL EMITTER SEMICONDUCTOR DEVICE

Gene Strull, Pikesville, Md., assignor to Westinghouse Electric Corporation, East Pittsburgh, Pa., a corporation of Pennsylvania Filed June 20, 1960, Ser. No. 37,377
2 Claims. (Cl. 317—235)

This invention relates to a multi-terminal semiconductor device.

This application is a continuation-in-part of U.S. patent application Serial No. 852,115, filed November 10, 1959, the assignee of which is the same as that of the present invention, which application has now been abandoned.

An object of the present invention is to provide multi-terminal semiconductor switching device suitable for use in an electrical system which can function as a multi-terminal "OR" device on "turn on" and as an "AND" device on "turn off."

Another object of the present invention is to provide multi-terminal semiconductor switching device suitable for use in an electrical system as a multi-terminal "OR" device on "turn on" and as an "AND" device on "turn off," the device being comprised of four regions including one base region, one collector region, and a plurality of independent emitters which are capable of being fired separately.

Other objects of the present invention will, in part, be obvious and will, in part, appear hereinafter.

For a better understanding of the nature and objects of the invention, reference should be had to the following detailed description and drawings, in which.

Figure 1:
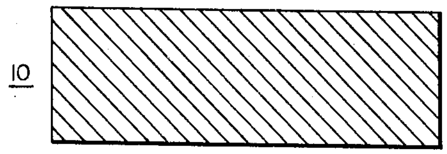
FIGURE 1 is a side view, in cross section, of a wafer of semiconductive material.
Figure 4:
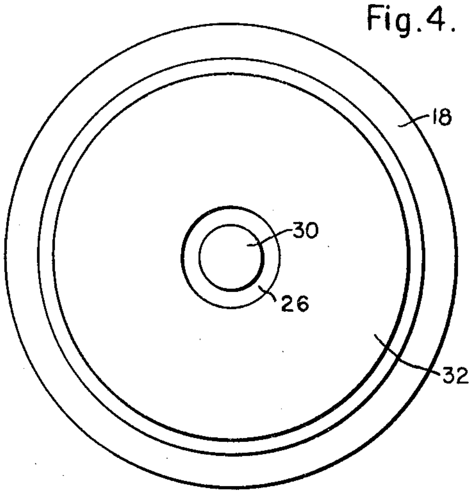
Figures 5, 6:
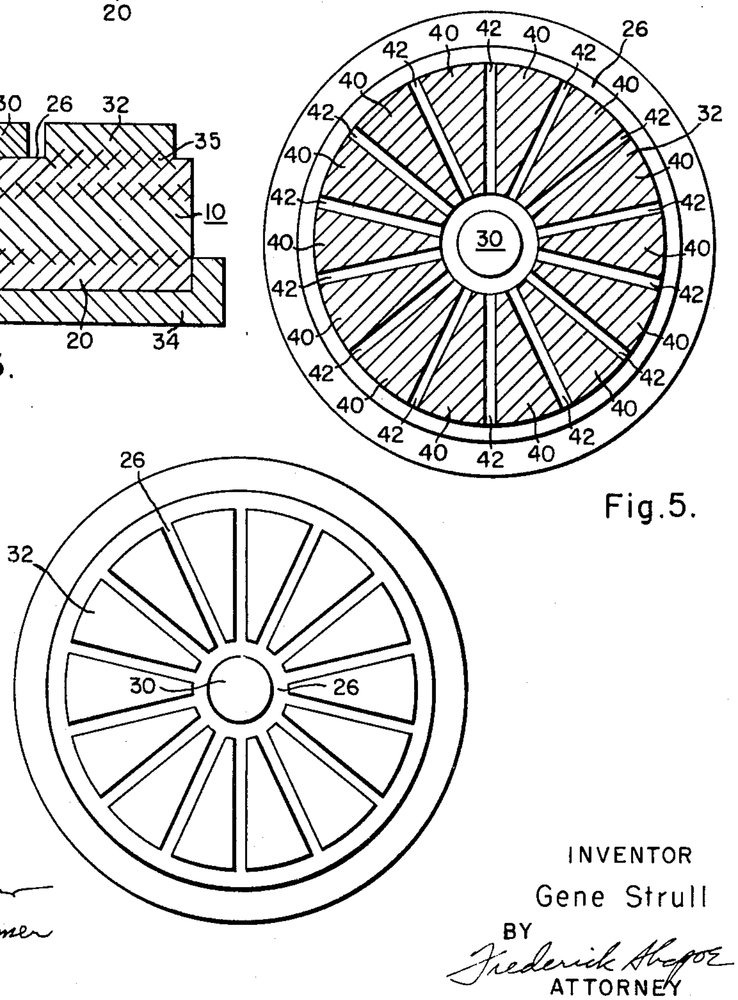
Figure 7:
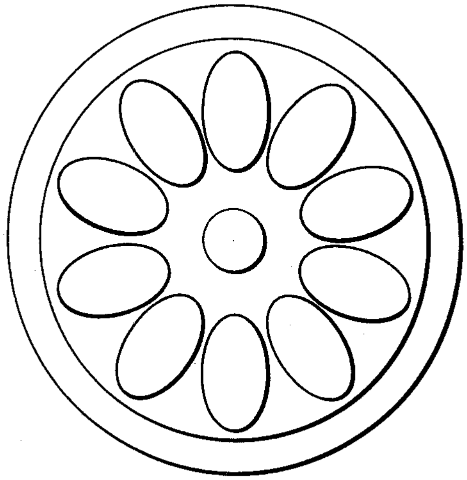
Figure 8:
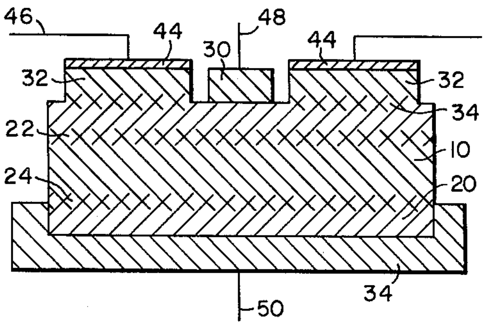
Figure 9:
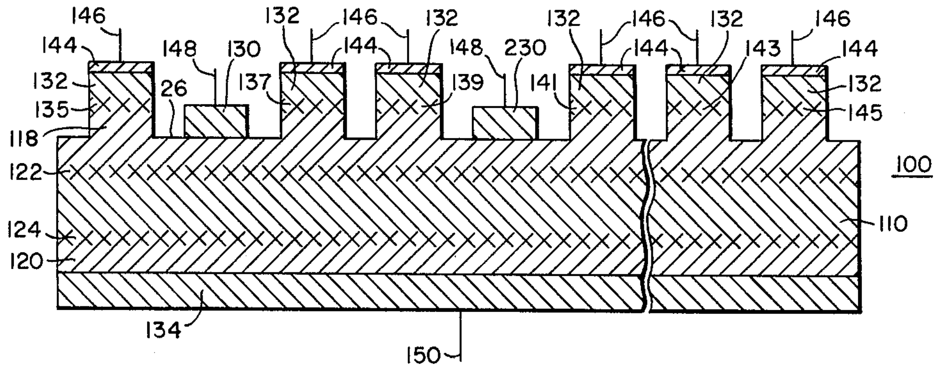

FIGS. 4 through 6, inclusive, are top views of the wafer of FIG. 1 during the various stages of processing in accordance with the teachings of this invention;

FIG. 7 is a top view of the multi-terminal semiconductor device of this invention in a modified form;

FIG. 8 is a side view in cross section of a semiconductor multi-terminal device prepared in accordance with the teachings of this invention; and FIG. 9 is a side view in cross section of the semiconductor device of this invention in modified form.

In accordance with the present invention and attainment of the foregoing objects, there is provided a multi-terminal semiconductor switching device comprising a collector region, a base region, said collector and base region being of a first-type of semiconductivity, a region of a second-type of semiconductivity disposed between said base and said collector region and forming a p-n junction with said base and said collector region, and a plurality of independent emitter regions of said second-type of semiconductivity disposed upon one surface of said base region. It should be understood that in this device, the "collector" region functions as an emitter.

For the purpose of clarity, the present invention will be described specifically in terms of an n-p-n-p silicon device. It will, however, be understood that the invention is applicable in a similar manner to produce p-n-p-n devices. The semiconductive material employed may be silicon, germanium, silicon carbide or a stoichiometric compound comprised of elements from Group III of the Periodic Table, for example, gallium, aluminum, and indium, and elements from Group V, for example, arsenic, phosphorus and antimony. Examples of suitable III–V stoichiometric compounds include gallium arsenide, gallium antimonide, indium arsenide and indium antimonide.

With reference to FIG. 1, there is illustrated a silicon wafer 10 of n-type semiconductivity. The wafer 10 may be prepared by any of the methods known to those skilled in the art. For example, a silicon rod may be pulled from a melt comprised of silicon and at least one element from Group V of the Periodic Table, for example, arsenic, antimony or phosphorus. The wafer 10 is then cut from the rod with, for example, a diamond saw. The surfaces of the wafer may then be lapped, or etched, or both to produce a smooth surface after sawing.

The wafer 10 may also have been cut from a section of a dendritic crystal prepared in accordance with U.S. patent application Serial No. 844,288, filed October 5, 1959, the assignee of which is the same as that of the present application, now Patent No. 3,031,403, April 24, 1962. If the wafer is cut from a dendrite, the lapping or etching steps following cutting will not be necessary.

Figure 2:
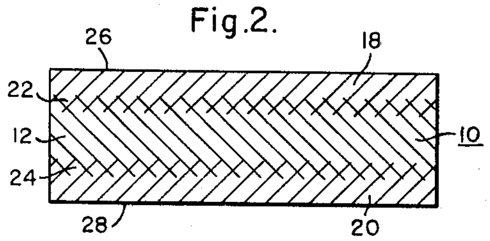
FIGS. 2 and 3 are side views, in cross section, of the wafer of FIG. 1 undergoing treatment in accordance with the teachings of this invention.

The wafer 10 is disposed in a diffusion furnace. The hottest zone of the furnace is at a temperature within the range of 1100° C. to 1250° C. and has an atmosphere of the vapor of an acceptor doping material, for example, indium, gallium, aluminum, or boron. The zone of the furnace within which a crucible of said acceptor impurity lies may be at a temperature of from 500° C. to 1250° C., the specific temperature being chosen to ensure the desired vapor pressure and surface concentration of diffusant from the crucible. The acceptor impurity diffuses into the surfaces of n-type wafer 10. A p-type region 18 and a p-type region 20 is formed in the top and bottom surface portions respectively of the wafer 10 with an n-type region 12 disposed therebetween. A p-n junction 22 exists between p-type region 18 and n-type region 12, and a p-n junction 24 exists between p-type region 20 and n-type region 12. Any p-type layer formed on the sides is removed by abrading or etching or both, or the sides are masked so that no diffusion therein can occur. The resultant structure is illustrated in FIG. 2.

An ohmic base contact 30 and an emitter layer 32 are disposed upon top surface 26 of the p-type region 18. An ohmic collector contact 34 is disposed upon the bottom surface 28 of p-type region 20.

The ohmic base contact 30, which is disposed upon surface 26 of p-type region 18, is comprised at least in part of at least one element of Group III of the Periodic Table, for example, boron, aluminum, gallium and indium, having p-type doping characteristics, the remainder, if any, being a neutral metal. The base contact 30 may also be comprised of an alloy, for example, a 99%, by weight, gold—1%, by weight, boron alloy, a gold-gallium alloy, a silver-tin-indium alloy, or a 90%, by weight, silver—10%, by weight, indium alloy.

An emitter 32, preferably a solid member of annular or circular configuration, is disposed upon top surface 26 of p-type region 18 about and separated from the ohmic base contact 30. The emitter 32 and base contact 30 are physically isolated and electrically insulated from each other.

The emitter 32 is comprised at least in part of one element of Group V of the Periodic Table, for example, phosphorus, arsenic, antimony, such elements having n-type doping characteristics, and the remainder, if any, being a neutral metal. The emitter 32 may also be comprised of an alloy, for example, a gold-arsenic, gold-antimony, silver-antimony or silver-arsenic alloy.

The ohmic collector contact 34 is comprised at least in part of one element of Group III of the Periodic Table, for example, boron, aluminum, gallium and indium, such elements having p-type doping characteristics, the remainder, if any, being a neutral metal. Examples of suitable alloys are those set forth above relative to the ohmic base contact 30.

The ohmic base contact 30, the emitter 32, and the ohmic collector contact 34 are disposed on the various surfaces of p-type region 18 and p-type region 20 as described above and fused thereto by heating in a vacuum or inert atmosphere, for example, a vacuum having an absolute pressure of from $10^{-2}$ to $10^{-5}$ mm. Hg or, for example, in argon or helium atmosphere.

Figure 3:
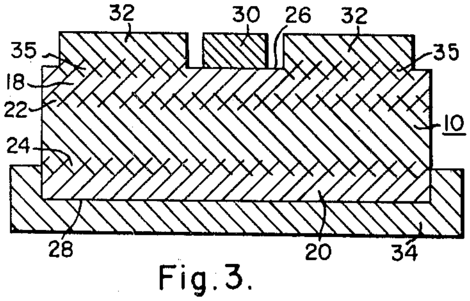

The resultant structure after fusion is illustrated in FIG. 3. The base contact 30 is fused to top surface 26 of the p-type region 18. The collector contact 34 is fused to the bottom surface 28 of the p-type region 20. In FIG. 3, the ohmic collector contact 34 is illustrated as being disposed along the entire bottom and up the sides of region 20; this configuration is not necessary, and the joint between collector contact 34 and p-type region 20 may be limited to surface 28 of the p-type region 20. The solid emitter 32 is fused to the p-type region 18 along top surface 26 thereof. A p-n junction 35 exists between the n-type emitter 32 and the p-type region 18.

With reference to FIG. 4, there is illustrated a top view of the structure of FIG. 3. It will be noted that the solid annular emitter 32 is shown disposed about ohmic contact 30 upon top surface 26 of p-type region 18.

With reference to FIG. 5, a masking material 40, for example, an organic wax, rubber or a resin is disposed upon the top surface of the emitter 32 in a predetermined configuration so that it is divided into a number of symmetrically disposed areas separated by unmasked portions 42. The top surface of the emitter 32 is then preferentially etched with a suitable etchant, for example, an etchant comprised of nitric acid, hydrofluoric acid and acetic acid whereby the unmasked portions 42 of the emitter 32 are etched away. The resultant structure after etaching is that shown in FIG. 6. The emitter 32 is now comprised of a plurality of similar individual segments, each individual segment being structurally, physically, and electrically isolated from all the other emitter segments.

It will be understood that while the above process for producing an emitter structure 32 to surface 26 has been described, other procedures will be equally satisfactory. For example, a plurality of individual emitter segments may be disposed about surface 26 of region 18 in a predetermined configuration and each individually fused to establish a p-n junction between the emitter segment and the region 18. In addition, a solid annular emitter structure could be disposed upon surface 26 in the manner described above and by the use of electron bombardment, with resultant melting and recrystallization, the emitter material could be fused with the region 18 in a predetermined configuration. Upon etching the non-electron bombarded portion will be removed preferentially.

In addition, while the individual emitters have been illustrated as being substantially wedge-shaped, it will be understood that each could be of circular, elliptical, or rectangular configuration, or the like. Such a modification is illustrated in FIG. 7.

With reference to FIG. 8, metal contacts 44, for example, contacts of copper, silver and the like, are fused to the upper surface of each individual emitter fragment 32. Electrical leads 46, 48 and 50 are then soldered, brazed or otherwise suitably joined to the individual emitter contacts 44, the base contact 30 and the collector contact 34, respectively. This multi-terminal semiconductor device of this invention is suitable for use as a multi-terminal device which will function as an "OR" device on "turn on" and an "AND" device on "turn off."

The device of FIG. 8 is prepared so that the individual separate emitters function independently, so far as the collector voltage with respect to any one of the other emitters is concerned. The device, therefore, is actually comprised of a plurality of electrically cooperative 4-region semiconductor devices. If any one of the individual 4-region devices fires, due to the common regions beneath the emitters, all the other elements will go into the "on" state. That is, when one 4-region device is placed in the conducting state all of the other 4-region devices will conduct. However, to turn the device off, it is necessary to turn off all of the individual 4-region devices simultaneously.

Since each segment of the device of this invention is a three-terminal device it is possible to effect the firing voltage by means of a suitably applied emitter to base voltage. It is possible to arrange the device with the proper bias base to each emitter element. Thus, the firing voltage of each emitter element can be set to a predetermined value. Therefore, the multi-terminal semiconductor device of FIG. 8 is a multiple-terminal "OR" device on "turn on" and an "AND" device on "turn off" built within a single semiconductor body.

In addition to being built on a circular wafer of a semiconductor material as described above, the device of this invention may be built on, for example, a rectangular or elongated body of semiconductor material as illustrated in FIG. 9. The device 100 of FIG. 9 is comprised of a common base, region 118, a common collector region 120 and a plurality of emitters 132. There is a p-n junction 135, 137, 139, 141, 143 and 145, respectively, between each of the emitters and the common base region 118. There is a p-n junction 122 between base region 118 and region 110, and a p-n junction 124 between region 110 and collector region 120. There is a first base contact 130 and a second contact 230 disposed upon the top surface 126 of the base region 118. When the device of this invention is prepared on a circular wafer, as shown in FIG. 8, only one common base contact is employed. However, when the device is fabricated on a rectangular body, as illustrated in FIG. 9, it may be necessary to have two or more base contacts to compensate for the voltage drop through the length of the common base region. This is particularly true when the base region has a high resistivity. The composition of the base contact or contacts will be the same as that discussed hereinabove. The device 100 has an ohmic collector contact 134 fused to the bottom surface of the collector region 120. There are also ohmic contacts 144 affixed to the top surface of each emitter region. Electrical leads 146, 148 and 150 are affixed to the ohmic emitter contacts 144, the ohmic base contacts 130 and 230 and the ohmic collector contact 134, respectively.

The device of FIG. 9 is structurally essentially the same as the device of FIG. 8. That is the device is comprised of a plurality of electrically cooperating 4-region semiconductor devices all contained within one piece of semiconductor material.

The device of FIG. 9 is functionally identical to the device of FIG. 8. If any one of the individual 4-region semiconductor devices fires, due to the common regions beneath the emitters, all the other elements will go into the "on" state. However, to turn the device off, it is necessary to turn off all of the individual 4-region devices simultaneously.

The multi-terminal semiconductor device of this invention may be modified in a number of other ways, for example, one modification would consist of making the emitters unsymmetrical with regard to area, depth, or doping level, and the device would, therefore, have built into it the ability to have various signals affect it in such a way as to trip the entire device sequentially or collectively through any one of the separate emitters.

The utility of the device of this invention will be immediately obvious to those skilled in the art, and with such a device it is possible to simulate a number of logic functions.

One very important use of the device of this invention in modern technology is in rocketry. For example, at the present time various components of a rocket or guided missile are connected through an "OR" circuit to a control board. During a "count down," if a component malfunctions, the malfunction is signaled by an electrical signal which passes through the "OR" circuit and lights signal lights on the control board. When the malfunction is corrected the light on the control board goes out. This technique has two apparent shortcomings. First, two substantially simultaneous malfunctions are detected as only one, and when one is corrected the signal lights will go off, and secondly, if the malfunction has adversely affected a second component that has already been checked, the damage to the second component may go undetected. If the device of this invention is substituted for the "OR" circuit, and a malfunction occurs, the lights on the control board will light up as with an "OR" circuit. However, all the components must be again checked simultaneously before the lights on the control panel will go out. Thus, it is impossible for a second malfunction to be overlooked, or for damage to a previously checked component to escape notice.

The following example is illustrative of the practice of the teachings of this invention.

*Example*

A flat circular wafer of n-type silicon having a resistivity of from 50 to 100 ohm cm. and a diameter of ⅜ inch and a thickness of 5 mils was disposed in a diffusion furnace. The diffusion furnace was at a maximum temperature of 1200° C. and had a gallium vapor atmosphere. The gallium was allowed to diffuse through the flat parallel faces of the wafer to a depth of approximately 1.5 mils. The wafer was then removed from the diffusion furnace.

Thereafter, the bottom surface of the wafer was disposed on the top surface of a gold-boron foil of 1.5 mils thick on top of a metal disc comprised of molybdenum. The molybdenum disc had a diameter of ⅜ inch and a thickness of 30 mils and with the gold-boron was the collector contact. A base contact, in the form of a foil having a diameter of 50 mils and a thickness of 1.0 mil and comprised of gold with a few hundredths of one percent of boron was disposed centrally on the top surface of the wafer.

A solid foil of annular configuration having an outside diameter of just under ⅜ inch and an inside diameter of 60 mils and comprised of 99.5%, by weight, gold and 0.5%, by weight, antimony was disposed about the base contact on the top surface of the wafer.

The entire assembly was then disposed in a fusion furnace and heated to a temperature of approximately 750° C. for a period of 15 minutes, whereby the collector contact and the base contact fused to the bottom and top surface of the wafer respectively. The emitter foil fused into and formed a p-n junction with the top of the wafer.

An organic wax mask was disposed in a predetermined pattern upon the top surface of the emitter foil as shown in FIG. 6. The top surface of the emitter foil was then preferentially etched first with aqua regia to remove the gold and then with a mixture comprised of nitric acid, hydrofluoric acid and acetic acid. After etching, the organic wax masking composition was removed from the unetched portion. The assembly is now that shown in FIG. 6 of the drawing.

Thereafter, electrical leads or contacts comprised of, for example, copper wire was soldered or otherwise joined to each individual emitter contact and to the base and collector contact. The assembly is the multi-terminal semiconductor device illustrated in FIG. 8.

The device thus prepared is suitable for use in accordance with the description set forth above. That is, the device will function as an "OR" circuit on "turn on" and an "AND" circuit on "turn off."

It will be understood that while the utility of the device of this invention has been explained in the terms of an "OR" circuit and an "AND" circuit, those skilled in the art will appreciate that the device will have other numerous and various functions.

While the invention has been described with reference to particular embodiments and examples, it will be understood that modifications, substitutions and the like may be made therein without departing from its scope.

I claim as my invention:

1. A multi-terminal semiconductor device comprised of a material selected from the group consisting of silicon, germanium, gallium arsenide, gallium antimonide, indium arsenide and indium antimonide and having a collector region, a base region, said collector and said base regions being of a first-type of semiconductivity, a region of a second-type of semiconductivity disposed between said base and said collector region, a p-n junction between said base and said collector region and said region of second-type semiconductivity, a plurality of discrete emitter regions disposed upon unequal areas of one surface of said base region, and a p-n junction between each discrete emitter region and said base region, each of said plurality of emitter regions having an area unequal to that of the other of said plurality of emitter regions to provide a different response to applied signals, each emitter region being capable of being separately biased, and a plurality of terminal means individually disposed on each emitter region, said base region and said collector region.

2. A semiconductor device comprising a wafer of a semiconductor material selected from the group consisting of silicon, germanium, gallium arsenide, gallium antimonide, indium arsenide and indium antimonide, said wafer having a central region of a first type of semiconductivity, a top region and a bottom region, said top and said bottom regions having a second-type of semiconductivity, a p-n junction between one surface of said top region and one surface of said central region, a p-n junction between one surface of said bottom region and the other surface of said central region, a collector contact disposed upon the other surface of the bottom region, a base contact disposed upon the other surface of the top region, and a plurality of at least three discrete emitter regions of said first type of semiconductivity disposed upon said other surface of the top region, each of said plurality of emitter regions having a doping concentration different than that of the other of said plurality of emitter regions to provide a different response to applied signals, and an individual contact to each of said emitter regions.

References Cited by the Examiner

UNITED STATES PATENTS

| | | | |
|---|---|---|---|
| Re. 25,389 | 5/63 | Harrick | 307—88.5 |
| 2,524,035 | 10/50 | Bardeen et al. | 317—235 X |
| 2,910,634 | 10/59 | Rutz | 317—235 |
| 2,923,870 | 2/60 | Zelinka | 317—235 |
| 2,967,793 | 1/61 | Philips | 317—234 |
| 2,980,832 | 4/61 | Stein et al. | 317—235 |

JOHN W. HUCKERT, *Primary Examiner.*

SAMUEL BERNSTEIN, JAMES D. KALLAM, DAVID J. GALVIN, *Examiners.*